United States Patent
Avalos et al.

(10) Patent No.: US 10,431,127 B2
(45) Date of Patent: Oct. 1, 2019

(54) TAMPER-EVIDENT SEAL FOR ELECTRICITY METERS

(71) Applicant: Dario Iturria Avalos, Col. Santa Cruz Atoyac (MX)

(72) Inventors: Dario Iturria Avalos, Co. Santa Cruz Atoyac (MX); Guillermo Iturria Macazaga, Col. Santa Cruz Atoyac (MX)

(73) Assignee: Dario Iturria Avalos, Delegacion Benito Juarez (MX)

( * ) Notice: Subject to any disclaimer, the term of this patent is extended or adjusted under 35 U.S.C. 154(b) by 0 days.

(21) Appl. No.: 15/757,295

(22) PCT Filed: Aug. 29, 2016

(86) PCT No.: PCT/MX2016/000089
§ 371 (c)(1),
(2) Date: Mar. 2, 2018

(87) PCT Pub. No.: WO2017/039428
PCT Pub. Date: Mar. 9, 2017

(65) Prior Publication Data
US 2018/0247571 A1    Aug. 30, 2018

(30) Foreign Application Priority Data

Sep. 2, 2015 (MX) .................. MX/a/2015/011480
Jul. 29, 2016 (MX) .................. MX/a/2016/009940

(51) Int. Cl.
*G09F 3/03* (2006.01)
*G09F 3/00* (2006.01)
(Continued)

(52) U.S. Cl.
CPC .......... *G09F 3/0335* (2013.01); *G01R 15/00* (2013.01); *G01R 21/00* (2013.01); *G09F 3/00* (2013.01);
(Continued)

(58) Field of Classification Search
CPC ...... G01R 21/00; G01R 22/066; G01R 11/24; E05B 65/0089
See application file for complete search history.

(56) References Cited

U.S. PATENT DOCUMENTS

4,674,778 A    6/1987 Ruiz
5,647,620 A *  7/1997 Kuenzel ................. B65D 55/06
                                                  292/307 R
(Continued)

*Primary Examiner* — Son T Le
*Assistant Examiner* — Dustin R Dickinson
(74) *Attorney, Agent, or Firm* — Umberg Zipser LLP (57) ABSTRACT

This invention is referred to a guarantee seal for non-opening electrical energy consumption meters with mechanical seal type padlock, disposable of a single use; for sealing or closing some container, box, door, cabinet, meter, valve, pump, bag, carrier bag, water tank, etc., meanly used for the electricity meters commonly used in countries of North America, Central and South America; whose purpose is protecting and controlling the electricity theft, guarantying its immobility. Such guarantee seal has a unique shape that fits exactly with the cavities of the meters and it gets in by pressure, therefore if the seal is located outside of such cavity its external manipulation is evident, furthermore, it has a lid, a base, a verification system by continuity and tag or RFID tag to ensure the integrity of such seal.

13 Claims, 7 Drawing Sheets

(51) Int. Cl.
*G01R 15/00* (2006.01)
*G01R 21/00* (2006.01)

(52) U.S. Cl.
CPC .......... *G09F 3/0311* (2013.01); *G09F 3/0323* (2013.01); *G09F 3/0376* (2013.01)

(56) References Cited

U.S. PATENT DOCUMENTS

| | | |
|---|---|---|
| 6,457,754 B1 | 10/2002 | Bystry et al. |
| 2005/0231365 A1 | 10/2005 | Tester et al. |
| 2010/0231388 A1 | 9/2010 | Shute et al. |
| 2011/0273852 A1* | 11/2011 | Debrody ............... G09F 3/0317 361/747 |
| 2012/0261476 A1 | 10/2012 | Bortz et al. |
| 2014/0265369 A1* | 9/2014 | Gryczynski ........... G09F 3/0358 292/320 |

* cited by examiner

TAMPER-EVIDENT SEAL FOR ELECTRICITY METERS

This invention is related to a non-reusable disposable guarantee seal for non-opening electrical energy consumption meters with mechanical closure type padlock; for sealing or closing some container, box, door, cabinet, meter, valve, pump, bag, carrier bag, water tank, etc., meanly used for the electricity meters commonly used in countries of North America, Central and South America; intended for protecting and controlling the electricity theft, guarantying its immobility.

Such guarantee seal has a unique shape that fits exactly with the cavities of the meters and it gets in by pressure. If the seal is located outside of such cavity its external manipulation is evident, furthermore, it has a lid, a base, a verification system for continuity and RFID tag or tag to ensure the integrity of such seal.

BACKGROUND OF THE INVENTION

In the art there are several seals or security seals for protection of products, however, such seals and/or security seals used especially in electricity meters in Mexico, use a pawl system linked to a female member in its side walls and a male member with arrow-shaped guide shoes, half arrow or gear. These seals have disadvantages because they can be violated not obviously or not easily visible through small perforations to the sides allowing to push the guide shoes, resulting easily releasable, besides not being suitable for joints where it is intended to maintain the inviolability and needs to be clearly evidenced the existence of handling.

Besides, the structures of the conventional seals use corrosive materials, such is the case with the lead seals which commonly use a twisted wire, for which the employment is not easy or practical since they need tools for closing as pliers for lead seals.

The design of conventional seals is usually colored, however, hardly they evince his fracture or manipulation.

In the prior art we have the patent document U.S. Pat. No. 4,263,697 which refers to one-piece security seal in one piece which is cheap and simple for manufacturing by mass production methods, however, it has drawbacks for leaving the clamp mechanism exposed to possible manipulation, i.e., such seal has deficiency because may be possible to alter, open, manipulate a good without leaving evidence of the opening non clearly.

The patent U.S. Pat. No. 5,782,513 is referred to a mechanical security seal of ergonomic design having an anchoring capsule, with a pawl system associated to a female element and a male element with arrow-shaped guide shoes, such invention presents the inconvenient that the arrow-shaped guide shoes may be replaced by the proximities to the side walls, i.e. the design of this system allows pushing the guide shoe through small perforations to the sides for being violated without leaving evidence.

On the other hand, the patent CA206938 is referred to a security seal for sealing units comprising two rectangular surfaces; the base and the lid joined along one side by a hinge, however, it has a drawback in the continuity between the two cavities, besides that the hinge is not a guarantee that the seal can be manipulated, conversely, if the seal is opened, it leaves no evidence that it has been compromised.

Thus, the above documents have been overcome in novelty, inventive step and industrial application by the present invention, an issue which is shown below in the description of the embodiments. This invention provides resistance of limited opening, likewise in the art there is not any security seal that by conductivity between installed terminals thereof, may indicate that it has been opened, making clear that the product was either altered or accessed; therefore, the device of the present invention allows to detect and counteract alterations, modifications, theft or pulling out of goods or products it wishes to protect because it can be of a transparent thermoplastic material which becomes apparent its fracture and handling; concisely the seal of the present invention increases by far the safety and ability to demonstrate unwanted openings, keeping standards of the ISO/PAS 17712 standard for security seals level 2.

BRIEF DESCRIPTION OF THE DRAWINGS

The accompanying drawings are included for providing a best understanding of the invention and are incorporated and they constitute part of this specification. The drawings illustrate the embodiments of the invention and along with the description serve to explain the principles of the invention.

DESCRIPTION OF THE EMBODIMENTS

Reference will be made in detail to the embodiments of this invention, the examples are illustrated in the accompanying drawings. Whenever possible, the same reference letters in the drawings and in the description to refer to the same parts are used.

The following description is presented to enable one skilled in the art to use the invention and is provided in the context of a patent application and its requirements. Various modifications of the described embodiments will be apparent to those skilled in the art and the generic principles taught in the same can be applied to other embodiments.

Thus, this invention is not intended be limited to the embodiment shown, but it is agreed the broader range consisting of the principles and features described herein.

The drawings illustrate the embodiments of the invention and along with the description serve to explain the principles of the invention. Besides, the reference letters are applied to the components, through this disclosure. The descriptive terminology has been adopted in order to enhance the reader's understanding with respect to the various views provided in the figures, and are not intended to be limiting.

Figure 1:
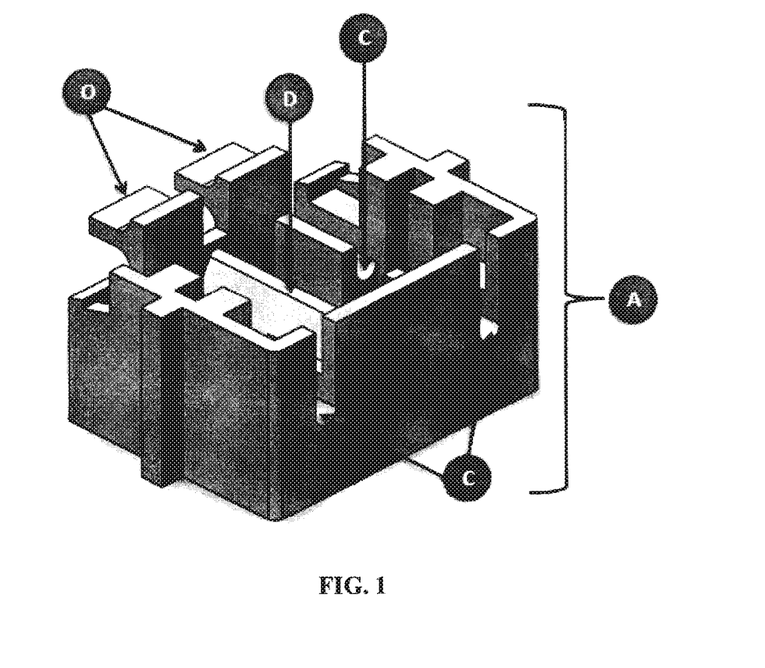
FIG. 1 illustrates an isometric top view of the base.

FIG. 1 illustrates an isometric top view of the base (A), in which we can observe:
- A guide channel (C) through which is passed a cable or wire (T) (not shown in the figures), usually stainless steel but not limited to this material, which pass through the base (A).
- A guide mechanism using a pair of punches (O) serving to assemble the continuity verification mechanism (N) and a single arrow-shaped pawl (D) which serves to assemble the cover (H).

Figure 2:
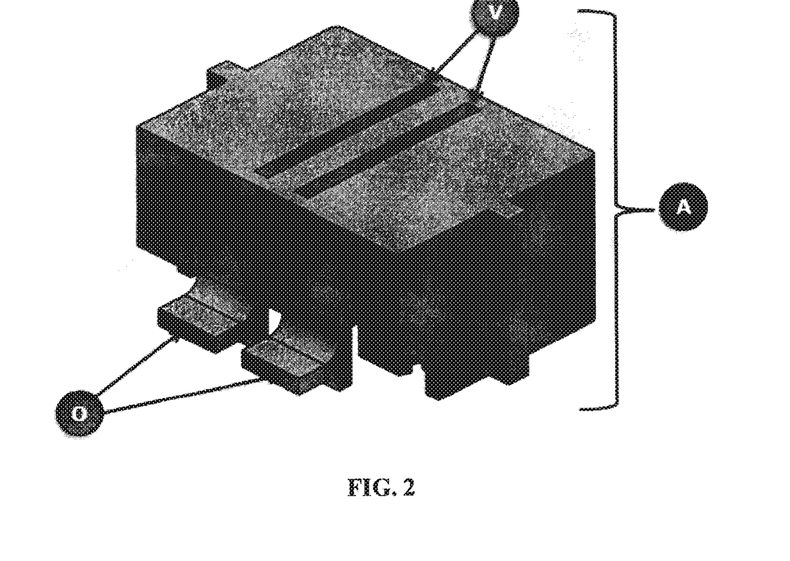
FIG. 2 illustrates an isometric bottom view of the base.

FIG. 2 illustrates an isometric bottom view of the base (A), in which we can observe:
- A pair of punches (O) serving as guide to assemble the continuity verification mechanism (N).
- A pair of forming slots(V), in such a way that the base (A) be injected and removed by injection without problems. These forming slots (V) are located on the underside of the base (A) to be in contact with the existing cavity of the base of the electric meters.

Figure 3:
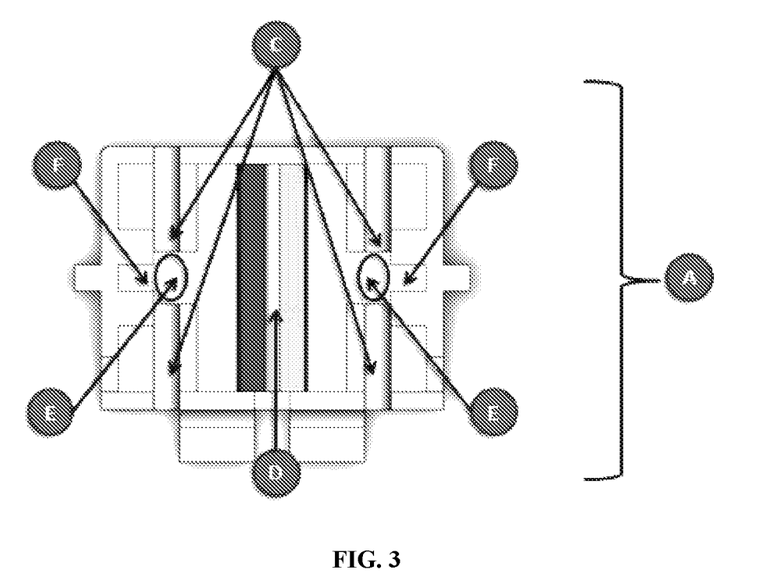
FIG. 3 illustrates a top view of the basis.

FIG. 3 illustrates a top view of the base (A), in which we can observe:
- Four guide channels (C) so that the cable or wire (T) passes from one end to another and is divided by a separation or slot (E) in the central part of such channels (C). This separation or slot (E) reaches the bottom of the base (A).
- Two rails (F), where such rails coincide with the separations or slots (E) of the channels (C).

Figure 4:
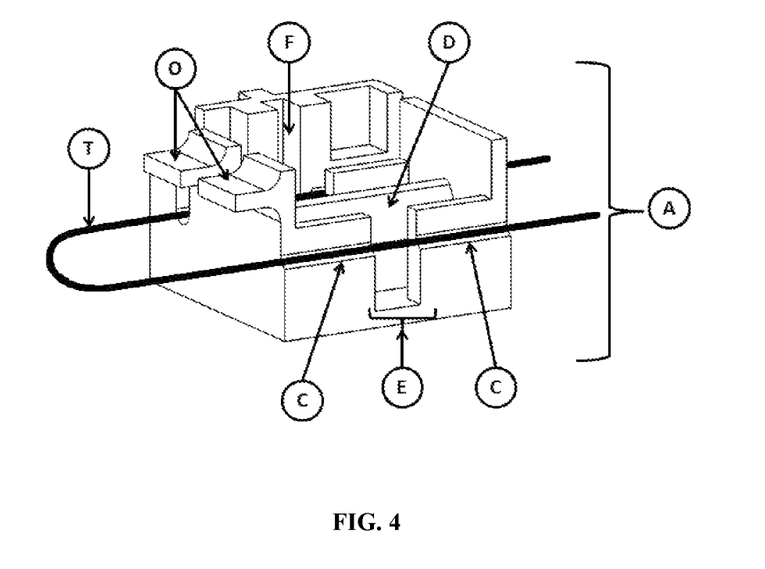
FIG. 4 illustrates an isometric view of side section cutting from the base at the same height of the channel.

FIG. 4 illustrates a cutting isometric view of side section of the base (A) to the height of the channel (C), in which we can see:
- The cable or wire (T) emerges from the guide channel (C) on the other side of the base (A), the cable (T) surrounds, moors or captures, that wishing to be sealed, and then the cable backs to the base (A) of the device for traversing it by the other channel (C) which also presents its separation or slot (E). Then, the cable is tightened firmly and the lid (H) of the device is used for closing the seal and maintain the cable (T) fixed without being able to be released.
- Then, the verification mechanism is assembled for continuity (N) which contains the fragile electricity conductor element (U) (not shown in the figures), for generating the assembly (L).
- Due to the seal has a unique shape that fits exactly into the cavity of the meters by pressure, in order to access to the forming slots (V), it is necessary to cut the cable or wire (T) that must be secured to the meter and tense after performing the assembly (L) and therefore it does not allow that the cavity seal rises.
- The rail (F) for its part has a tolerance so that the rectangular punch (I) of the lid (H) matches very tightly.
- The projection of the isometric angle of the single arrow-shaped pawl (D) against the horizontal is of 60.33°.

Figure 5A:
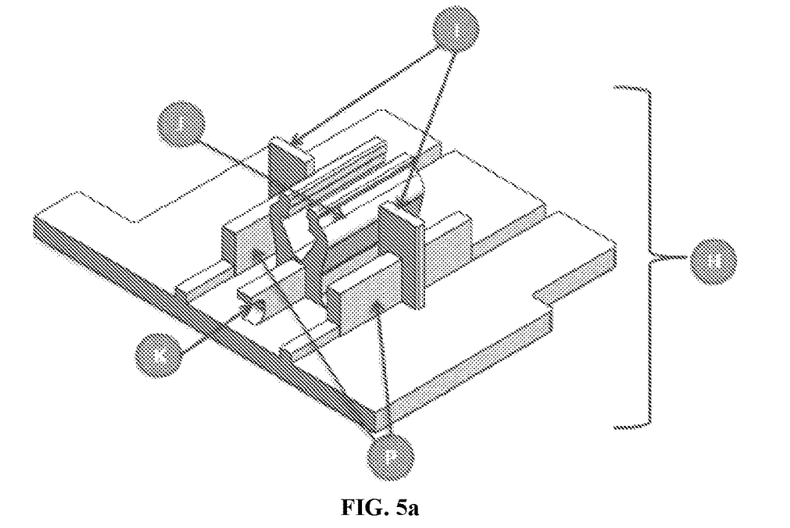
FIG. 5a illustrates an isometric bottom view of the lid.
Figure 5B:
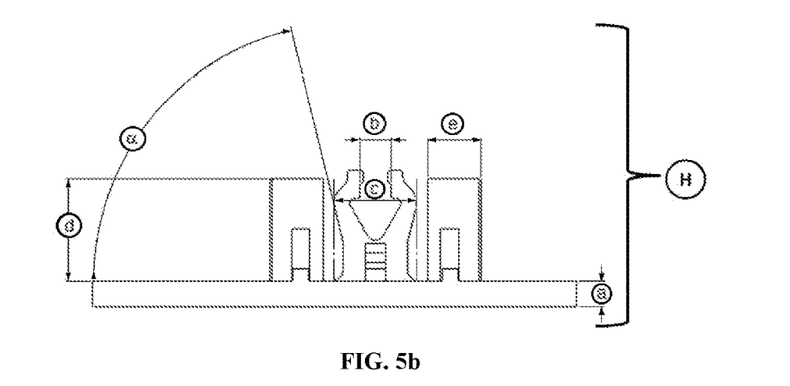
FIG. 5b illustrates a sectional view of the lid.

FIG. 5*a* illustrates an isometric bottom view of the lid (H), in which we can observe:
- The guide shoe shaped like clamp (J) used to hold the single arrow-shaped pawl (D) of the base (A), which get in by bending the material, making very difficult to violate the seal without causing visible and permanent damage.
- The lid (H) has a pair of rectangular punches (I) running on the rails (F) in the base (A). When the lid is assembled (H) with the base (A). Such punches (I) arrive very near the core of the base (A) and serves to press the cable (T), one in each guide channel (C). This generates two curls in the cable (T), one in each of the channels (C), while captures the curl of the cable (T) against the core of the base (A), thus, avoiding displacement or slipping of the cable (T). If found one end of the cable (T) free or open it indicates that was cut or broken the violated seal, showing external manipulation.
- The continuity verification mechanism (N) holds the fragile electricity conductor element (U) which will be destroyed by the hook (K) of the lid (H) when trying to remove it eliminating the electrical conductivity between the terminals (G). The purpose of this mechanism is to determine whether the seal has been managed to be opened in non-obvious way when checking the electrical continuity or no continuity through the tips of a multimeter in the terminals (G) which are formed to perform the complete assembly of the seal (L) and thus, verify whether the seal has been opened FIG. 5*b* illustrates a sectional view of the lid (H), in which we can observe the dimensions thereof:
- The space (b) between the guide shoe shaped like clamps (J) is 2.40 mm.
- The width (D of the rectangular punches (I) to the base (a) of the lid (H) is 8.25 mm, while the width (e) of each rectangular punch (I) is 4.29 mm.
- The projection of the isometric angle (a) of the guide shoe shaped like clamps (J) on the base (a) of the lid (H) is 76.29°.
- The thickness of the base (a) of the lid (H) is 2 mm.

Figure 6:
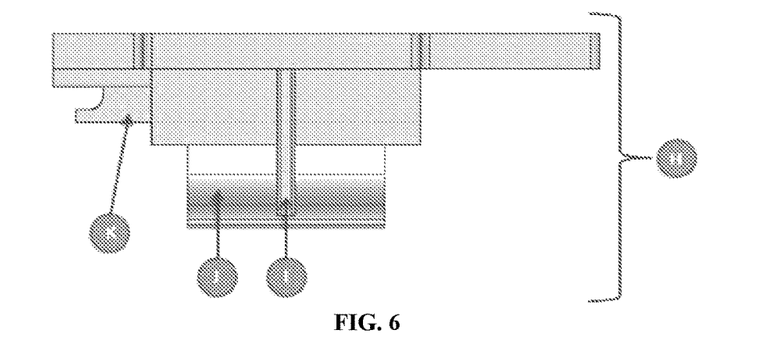
FIG. 6 illustrates a lateral view of the lid.

FIG. 6 illustrates a lateral view of the lid (H), in which we can observe:
- One of the rectangular punch (I) serving as opening barrier between the guide shoe shaped like clamp (J), resulting more difficult violating the security seal, because in case of wanting manipulate it without leaving evidence, should be achieved open the guide shoes shaped like clamp (J) to release the single arrow-shaped pawl (D) while the punches (L) limit its opening and moreover, at the same time should also be avoided activate the continuity verification mechanism (N) in a way for not showing that the seal was manipulated, opened or tampered.
- For avoiding security fails for the forming slots (V) of the base (A), the top of the guide shoe shaped like clamp (J) is designed for sealing such slot when making the assembly (L) in a way that the seal cannot be opened in non-obvious way. Additionally, any attempt to open the already assembled seal will provoke that the continuity verification system (N) be activated, since when lifting the lid (H) the hook will destroy the fragile electricity conductor element (U) eliminating the electrical conductivity between the terminals (G) and thus evidencing the opening attempt.

Figure 7:
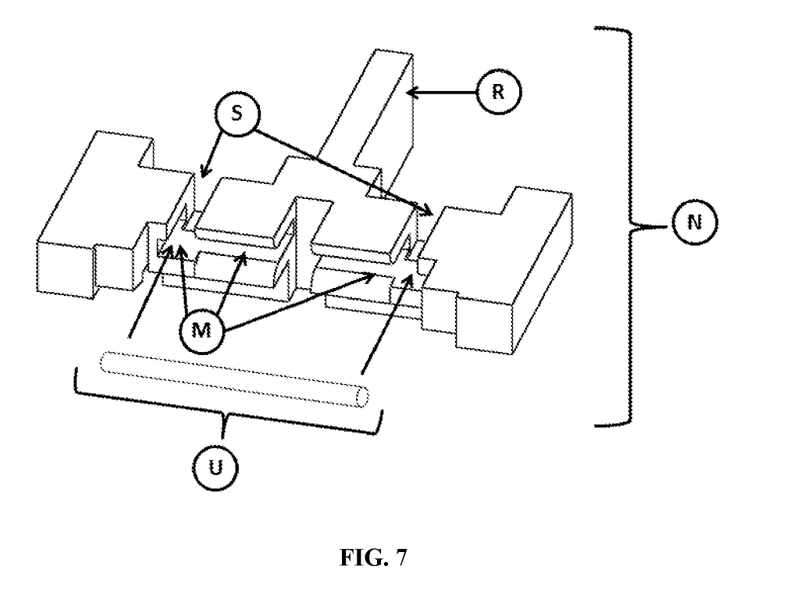
FIG. 7 illustrates a front isometric top view of the verification mechanism by assembled continuity.
Figure 8:
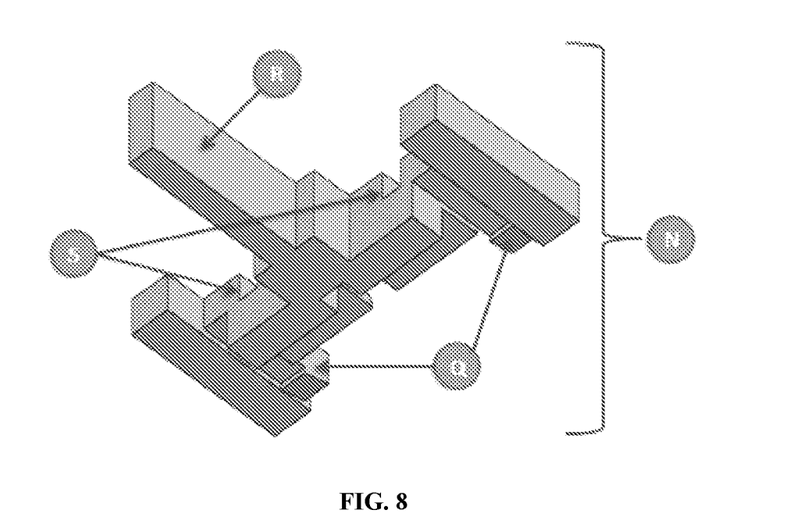
FIG. 8 illustrates a back isometric bottom view of the verification mechanism by assembled continuity.

FIGS. 7 and 8 illustrate an isometric view of the continuity verification mechanism (N), in which we can observe:
- A cannel (M) where the fragile electricity conductor element conductor of electricity (U) that simultaneously serves as assembly guide for the punches (O) of the base (A).
- Two pawls (Q) which will serve to make the assembly with the base (A).
- A lug (R) serving as fastening support in order to perform the assembly with the base (A), where by a click indicates that such assembly has been carried out correctly.

A pair of channels (S) which together with the punches (P) of the lid (H) will form the cavities (G) which will be used as terminals for check electrical continuity.

Figure 9:
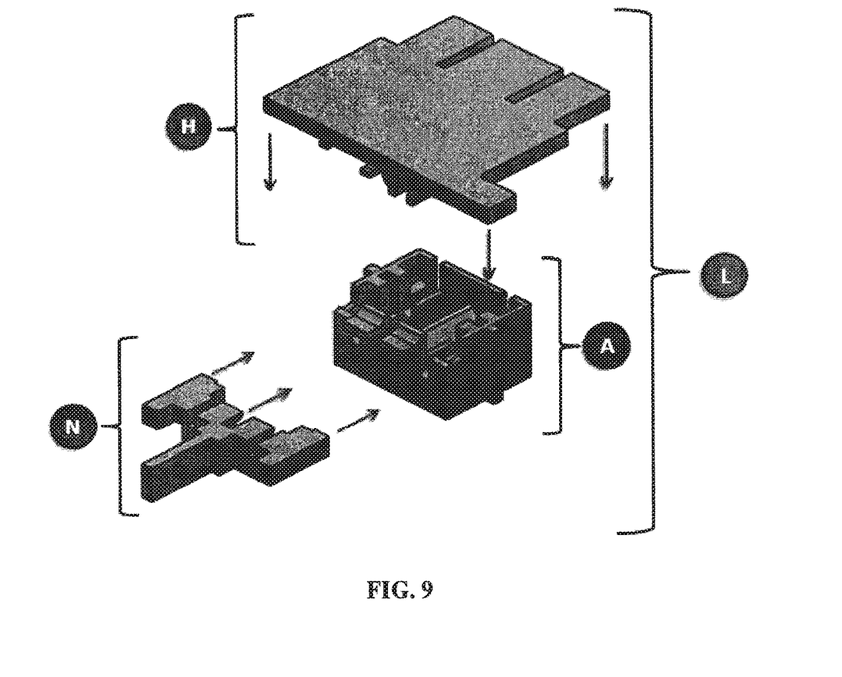
FIG. 9 illustrates an isometric exploded top view.

FIG. 9 illustrates an isometric exploded top view of the base (A), the lid (H) and the continuity verification mechanism (N) before the assembly (L), in which we can observe:

In the closure mechanism, the sealing faces both the base (A) as the lid (H) are driven by axial forces to fit perfectly, because of the magnitude of effective pressure between the guide shoe shaped like clamp (J) of the lid (H) and the single arrow-shaped pawl (D) of the base (A) in such a way that there is a click when assembling.

Similarly, the sealing faces of the continuity verification mechanism (N) having the fragile electricity conductor element (U) are pushed against the base (A) for being assembled, fitting perfectly after that the pressure magnitude between the pawls (Q) of the continuity verification mechanism (N) be pushed by the axial forces generated by effective pressure applied for carrying out such assembly while the punches (P) of the lid (H) and the punches (O) of the base (A) serve as guide for the channels (S) and the channel (M) of the continuity verification mechanism (N), respectively, when performing the assembly (L) where by means of a click indicates that such assembly has been carried out correctly.

In the perfect assembly (L), the tension bending plays an important role according to the material for the movement transmission since it is directly proportional to the resistance of such movement.

Figure 10:
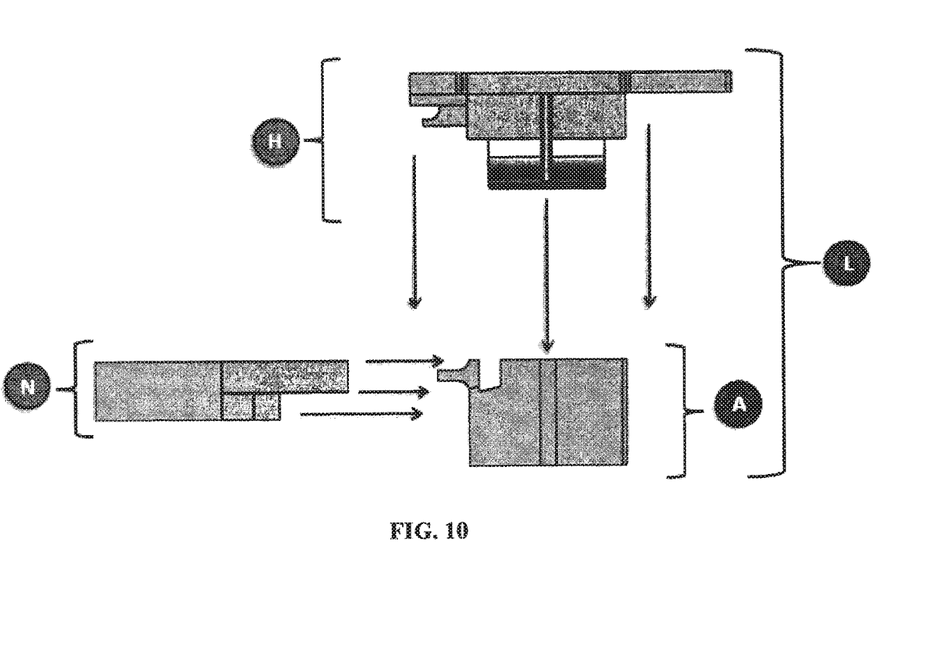
FIG. 10 illustrates a lateral view of the assembly process.

FIG. 10 illustrates a lateral view of the assembly process (L), in which we can observe:

First of all, the cable or wire (T) must be placed traversing one of the cavities (C) of the base (A) from end to end. Then, this cable or wire (T) must be arranged so that it surrounds, moors or capture that wanting to be sealed. Finally, such cable or wire (T) must back and traversing from end to end from the other channel (C) of the base(A).

Secondly, the lid (H) must be assembled on the base (A) in the direction indicated by figure (FIG. 10) while the punches (I) of the lid (H) are guided by the rails (F) of the base (A) until the guide shoes shaped like clamp (J) of the lid (H) open by bending and back to their original shape when ending surrounding the single arrow-shaped pawl (D) of the base (A).

Finally, the continuity verification mechanism (N) is assembled. For that the fragile electricity conductor element (U) is placed in the core of the channel (M) of the continuity verification mechanism (N). Then, such mechanism is fastened (N) by the lug (R) and pressed against the base (A) previously assembled with the lid (H) in the direction indicated by the figure (FIG. 10) while the top face of the continuity verification mechanism is kept into contact with the bottom face of the lid (H), the cavities(S) of the continuity verification mechanism (N) are aligned with the punches (P) of the lid (H) and the punches (O) of the base (A) are inserted in the channel (M) of the continuity verification mechanism (N) until the pawls (Q) of the continuity verification mechanism (N) have bended and returned to their original shape fastening against the inner face of the base (A).

Finally, and if the user wishes, the lug (R) of the continuity verification system (N) may be fractured by pressuring it in some direction perpendicular to its side faces.

Thanks to the continuity verification mechanism, being opened in non-obvious way, the user always can realize that the seal has been violated by the continuity checking between the cavities or terminal (G), which are formed in the assembly (L) between the punches (P) of the lid (H) and the channels (S) of the continuity verification mechanism (N). Therefore, when there is not continuity between the terminals (G) it is indicative that somebody opens or try to open the seal, the enough as to activate the continuity verification mechanism (N) by breaking the fragile electricity conductor element (U) contained in the channel (M) with the hook (K) of the lid (H).

The magnitude of the effective pressure of assembly is too important. The main contacting faces in the assembly process of the lid (H) and the base (A) are constituted by the guide shoe shaped like clamp (J) and the wedge formed by the single arrow-shaped pawl (D), respectively. Similarly, the main contacting faces in the assembly process of the continuity verification mechanism (N) and the base (A) are constituted by the sloped face of the pawls (Q) of the continuity verification mechanism (N) and the inner wall of the base (A). If this effective pressure of assembly is very high in any of the cases, both the wedge formed by the single arrow shaped pawl (D), the guide shoe shaped like clamp (J), the pawls (Q) of the continuity verification mechanism (N) and the inner wall of the base (A) may be fractured. Therefore, when fitting and assembling the pieces with an excessive effective pressure, the lid (H), the base (A) and the continuity verification mechanism (N) can be destroyed.

Figure 11:
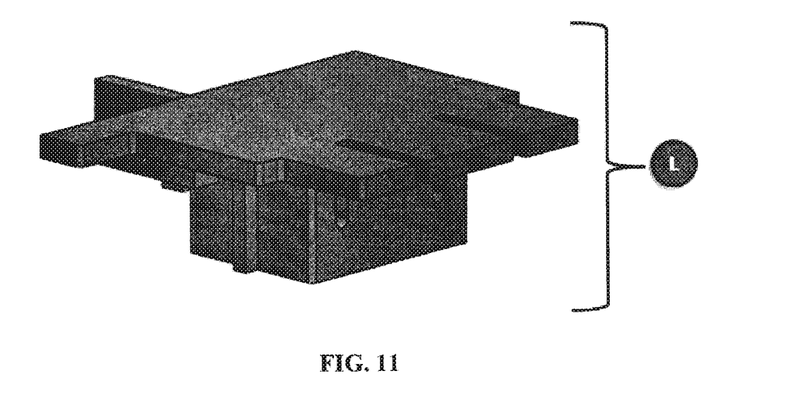
FIG. 11 illustrates an isometric top view of the assembly
Figure 12:
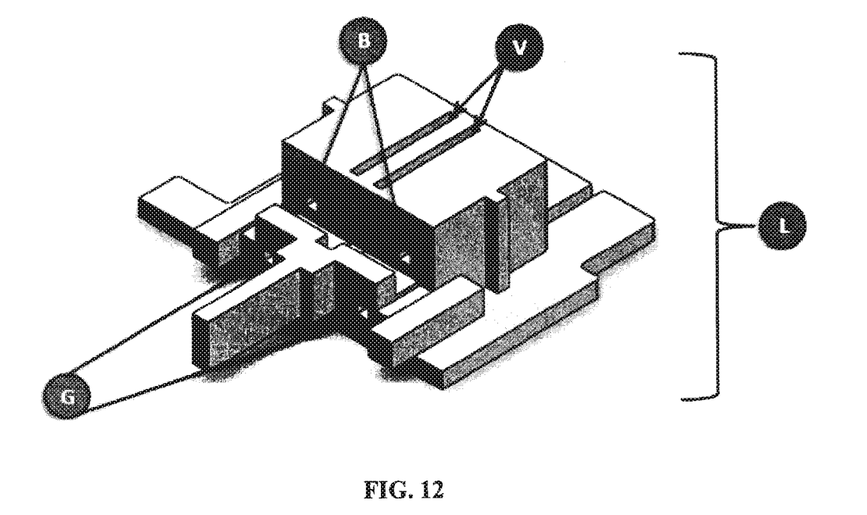
FIG. 12 illustrates an isometric bottom view of the assembly

FIGS. 11 and 12 show the assembly (L) from a top and bottom isometric view, in which we can observe:

The longitudinal punches (P) of the lid (H) together with the channels (C) of the base (A), when making the assembly (L), generate the cavities (B) by which the cable (T) will pass. Likewise, the longitudinal punches (P) of the lid (H) and the channels (S) of the continuity verification mechanism (N), when making the assembly (L), generate the cavities (G) which will be terminals by which the continuity will be reviewed with a multimeter.

The seal creates a flat surface between the rear of the electrical meters installed in Mexico and the top of the lid (H), can be accompanied by a highly destructible RFID tag (not shown in the figure) and of a single use joining of a single use joining the top surface of the lid (H) with the rear of the electrical meter. The breaking of the tag or its absence makes evident to the naked eye the opening of the seal.

The RFID technology allows reviewing remotely by a wireless reader a single identification number, which, if not correspond with the user records, makes evident the manipulation or alteration of the seal. If this tag is intended to be removed the RFID antenna is destroyed and cannot be read, likewise if it is replaced by some false tag which does not have the corresponding RFID antenna or in case of having RFID antenna which is programmed with a single identification number which does not correspond with the single identification number in the records of the user. All this generates evidence of the violation or violation attempt. In addition, to attempting to violate the meter, it would be necessary to break the tag or RFID tag, if this has been added after performing the assembly (L), and accommodate the seal in the cavity. Such cavity adheres the upper face of the lid (H) to the meter base avoiding lifting the seal of the cavity. Therefore, in addition to the lack of electrical conductivity between terminals (G), the opening evidence of the seal will be observed in the violation of the tag or RFID tag and/or finding one end of the cable (T) free, which will indicate that it was cut.

For the above, the system may include one or more intelligent RFID tags, wherein such tags involve the advantage of presenting traceability, making possible the automatization of the process of verification of the seals and meters, in combination with a software for the remote checking using a handheld RFID terminal as checking method, wherein such software manages the information and transmits it to a database for the auditing control of the integrity of seals and meters.

For all the above disclosed, the seal or assembled security seal (L) get in by pressure in the cavities of the meters, therefore, in case that the seal be outside of such cavity its external manipulation is evident.

Figure 13:
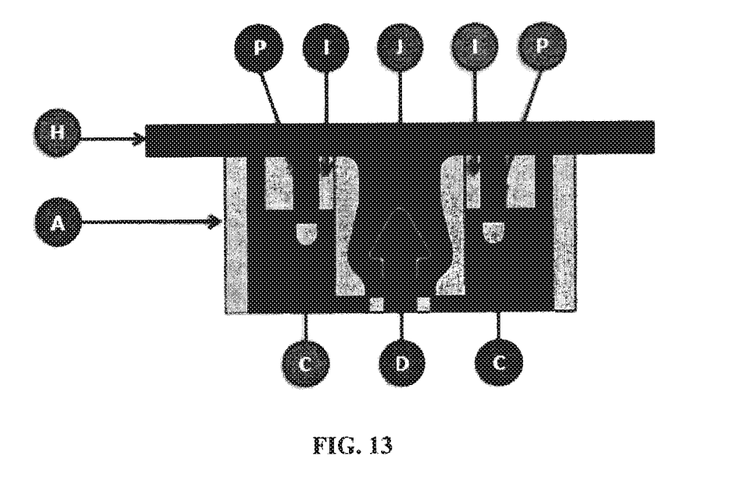
FIG. 13 illustrates a view of the front cutting section of the assembly at the same height of the pawl and guide shoe.

FIG. 13 illustrates a view of the front cutting section of the assembly (L) at the same height of the single arrow-shape pawl (D) and guide shoe (J), in which we can observe:

The assembly system (L) of the base (A) and the lid (H), where the single arrow-shaped pawl (D) is used and the guide shoe shaped like clamp (J) for making such assembly (L). The use of a guide shoe shaped like clamp (J) characterize to our seal, since it avoids the possibility of drilling to press the guide shoe shaped like clamp (J) and open the seal, since drilling is not enough, but the guide shoe (J) should be pulled, not push it, in order to release the assembly, something mechanically very complicated and more in small sizes.

Figure 14:
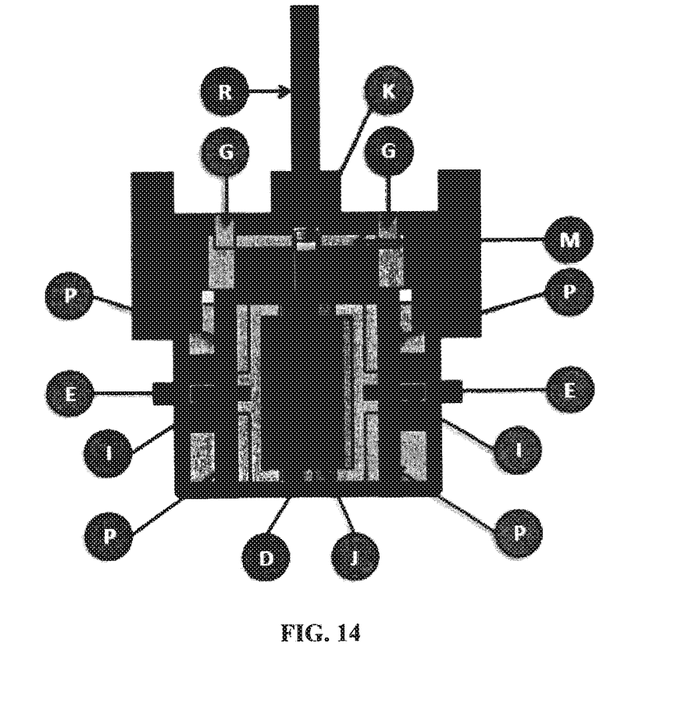
FIG. 14 illustrates a view of the top cutting section of the assembly with signs at the same height of the verification mechanism.

FIG. 14 illustrates a view of the top cutting section of the assembly (L) at the same height of the continuity verification mechanism (N).

Broadly, this device keeps closed an electrical circuit between two cavities or terminals (G) located in front of the seal by a fragile electricity conductor element (U) which is inserted into a channel (M) of the continuity verification mechanism (N) one moments before that such mechanism (N) be assembled with the base (a) and the seal is closed. This continuity or non-continuity can be checked by the tips of a multimeter in test mode of continuity, therefore any attempt to open the lid moves the hook (K) of the lid (H) fracturing the fragile electricity conductor element (U) contained in such mechanism (N), opening the electrical circuit. Thus, every time that the seal be reviewed the seal can read the continuity between the two cavities (G) and always there should be such continuity. If such continuity is not found, it is indicative that someone opened or tried to open the seal the enough as to activate the mechanism.

The material used to embody the seal or safety seal for electricity meters installed in Mexico of this invention, is the ABS thermoplastic, such material allows that the seal be perfectly uniform, ensuring an excellent contact between the base (A), the lid (H) and the continuity verification mechanism (N), unlike conventional seals.

The property of the ABS thermoplastic (acronym derived from the three monomers: acrylonitrile, butadiene and styrene) has good mechanical resistance to the impact, being more resistant than polystyrene due to the nitrile groups, therefore, such properties compared with the above material are: high tensile strength allowing withstand the effective pressure without breaking, high tensile strength, high resistance to abrasion and impermeable to water. However, the present invention is not limited to use ABS thermoplastic material, on the contrary, this invention may be embodied with any other material.

The manufacturing method of the guarantee seal object of this invention was carried out by plastic injection to reduce costs of mass production, however, such method is not limited to this, but rather can be carried out by any other manufacturing method. It is apparent to those skilled in the art that various modifications and variations to the structure of the present invention without departing from the spirit and scope thereof.

What is claimed is:

1. A single use guarantee seal for non-opening electrical energy consumption meters, comprising:
    a base (A) which includes a single arrow-shaped pawl (D), a pair of punches (O) and a pair of forming slots (V);
    a lid (H) which includes a pair of punches (P) and a pair of rectangular punches (I); and
    a continuity verification mechanism (N) including a tab (R), a channel bottom (M), a pair of channels (S) and at least a pair of pawls (Q);
    wherein a correct assembly (L) of said guarantee seal is generated when the base (A) is assembled with the lid (H) and subsequently the continuity verification mechanism (N) is assembled;
    wherein, for assembling such continuity verification mechanism (N), the tab (R) serves to hld said continuity verification mechanism (N) and be able to press it against the base (A), which was previously assembled with the lid (H), using the pair of punches (O) of the base (A) as guide until the pair of pawls (Q) of the continuity verification mechanism (N) are fastened to the base (A);
    wherein the channel bottom (M) of said continuity verification mechanism (N) carries a fragile electricity conductor element (U) that was inserted in said channel bottom (M) before performing the assembly (L), and
    wherein the pair of channels (S) of the same continuity verification mechanism (N) along with the pair of punches (P) of the lid (H) form a pair of cavities or terminals (G) among which there is an electrical continuity, being said electrical continuity possible because both of the cavities or terminals (G) are in contact with the fragile electricity conductor element (U).

2. The single use guarantee seal for non-opening electrical energy consumption meters according to claim 1, wherein further the structure of the base (A) comprises:
    at least four guide channels (C), which are arranged in pairs in such a way that the guide channels (C) of each pair are aligned to each other in order to guide a cable (T) of one end to another of the base (A);
    wherein said guide channels (C) and the pair of punches (P) of the lid (H) form at least four cavities (B) through which the cable (T) passes when the assembly (L) is completed;
    at least a pair of separations or slots (E) that separate the guide channels (C) which are aligned to each other;
    at least two rails (F) matching with the separations or slots (E) of the guide channels (C), wherein said rails (F) guide the punches (I) of the lid (H) when the assembly (L) is being made;
    and the single arrow-shaped pawl (D), which serves to assemble the base (A) with the lid (H).

3. The single use guarantee seal for non-opening electrical energy consumption meters according to claim 1, wherein the forming slots (V) are in the bottom face of the base (A), for being into contact with a cavity at the base of the electrical energy consumption meter that is being sealed.

4. The single use guarantee seal for non-opening electrical energy consumption meters according to claim 1 wherein the single arrow-shaped pawl (D) is projected at an angle of 60.33°.

5. The single use guarantee seal for non-opening electrical energy consumption meters according to claim 1, wherein further the structure of the lid (H) comprises:
- at least one guide shoe shaped like clamp (J) which serves to assemble the base (A) and the lid (H) by grabbing the single arrow-shaped pawl (D) head of the base (A) when the assembly (L) is made; and
- a hook (K) which, when the assembly (L) is correctly made, allows an electrical continuity between the terminals or cavities (G) that are in contact with the fragile electricity conductor element (U), and that, if someone tries to open the assembly (L) once it has been completed, said hook (K) will break the fragile electricity conductor element (U), eliminating the electrical continuity between the cavities or terminals (G).

6. The single use guarantee seal for non-opening electrical energy consumption meters according to claim 1 wherein the profile of the upper face of the lid (H) has a thickness (a) of 2 mm; the guide shoe shaped like clamp (J) forms a space (b) between its clamps of 2.40 mm, have a width (c) of 6.61 mm and generate an isometric angle projection (α) of 76.29° regarding the upper face of the lid (H); and the rectangular punches (I) have a length (d) of 8.25 mm and a width (e) of 4.29 mm.

7. The single use guarantee seal for non-opening electrical energy consumption meters according to claim 1, wherein during the assemble of the lid (H) with the base (A) is performed, at the moment the assembly (L) is being made, the guide shoe shaped like clamp (J) of the lid (H) makes a sound of "click" when the single arrow-shaped pawl (D) is grabbed by said guide shoe shaped like clamp (J).

8. The single use guarantee seal for non-opening electrical energy consumption meters according to claim 1, wherein the cable (T) tenses firmly when the assembly (L) is made, and that said cable (T) comes out through one of the cavities (B) of the base (A) and surrounds, ties or imprisons that which requires to be sealed for later returning and going through other one of the cavities (B) of the base (A).

9. The single use guarantee seal for non-opening electrical energy consumption meters according to claim 1, wherein when the assembly (L) is made, the rectangular punches (I) of the lid (H) press the cable (T) through the separations or slots (E) of the base (A), generating two curls in the cable (T), one on each of the aligned pairs of the guide channels (C), while said rectangular punches (I) imprison said curls of the cable (T) against the bottom of the base (A) thus, avoiding the displacement or slipping of the cable (T).

10. The single use guarantee seal for non-opening electrical energy consumption meters according to claim 1, wherein further the cable (T) is made of a material flexible enough to be able to form a pair of curls in said cable (T) at the moment in which the rectangular punches (I) of the lid (H) press said cable (T) through the separations or slots (E) of the base (A) when the assembly (L) is being made; in addition, said material must also be strong enough so that the cable (T) does not break, be cut or fractured by said rectangular punches (I) when said assembly (L) is being made.

11. The single use guarantee seal for non-opening electrical energy consumption meters according to claim 1, wherein the singe use guarantee seal further comprises an RFID tag that is placed adhering it to the upper face of the lid (H) and also to the electrical energy consumption meter or the like, that is being sealed, once that the assembly (L) has been made.

12. The single use guarantee seal for non-opening electrical energy consumption meters according to claim 11, wherein the RFID tag of said guarantee seal has an ability of being able to be linked to a data integrity verification system in order to prevent alteration or manipulation of any information contained in said tag.

13. The single use guarantee seal for non-opening electrical energy consumption meters and the like according to claim 11, wherein further it is a sign of tampering of the seal when the assembly (L) is made correctly and any of the following cases occurs: there is no continuity between the cavities or terminals (G), the RFID tag is broken, the RFID tag has a malfunction, the cable (T) is broken or cut, any of the pieces of the assembly (L) is broken, or any of the pieces the assembly (L) is missing; thus making evident, in any of said cases, an opening or an opening attempt of said seal.

\* \* \* \* \*